(12) United States Patent
Watford

(10) Patent No.: US 7,804,314 B2
(45) Date of Patent: Sep. 28, 2010

(54) ADJUSTABLE ELECTRICAL PROBES FOR CIRCUIT BREAKER TESTER

(75) Inventor: Russell T. Watford, Lawrenceville, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 0 days.

(21) Appl. No.: 12/370,863

(22) Filed: Feb. 13, 2009

(65) Prior Publication Data

US 2009/0206862 A1    Aug. 20, 2009

Related U.S. Application Data

(60) Provisional application No. 61/029,626, filed on Feb. 19, 2008.

(51) Int. Cl.
*G01R 31/28* (2006.01)
(52) U.S. Cl. ........................... 324/754; 324/761
(58) Field of Classification Search ................ 324/765, 324/761–762, 754, 158.1; 439/92, 482, 98
See application file for complete search history.

(56) References Cited

U.S. PATENT DOCUMENTS

| 4,092,587 | A | | 5/1978 | Selkow, Jr. |
| 4,923,407 | A | * | 5/1990 | Rice et al. ..................... 439/92 |
| 6,285,180 | B1 | | 9/2001 | Pas |
| 6,815,955 | B1 | * | 11/2004 | O'Neal, III .................. 324/424 |
| 2004/0189332 | A1 | | 9/2004 | Liang |
| 2005/0212526 | A1 | | 9/2005 | Blades |

FOREIGN PATENT DOCUMENTS

| DE | 20021685 U1 | 3/2001 |
| JP | 2000215781 A | 8/2000 |
| JP | 2007024699 A | 2/2007 |

* cited by examiner

*Primary Examiner*—Minh N Tang
*Assistant Examiner*—Tung X Nguyen
(74) *Attorney, Agent, or Firm*—Jose de la Rosa

(57) ABSTRACT

An electrical probe assembly includes a first probe housing pivotally connected to a base structure and receiving a first probe therein. The first probe is configured to interface with a first contact of an electrical component. A second probe housing is pivotally connected to the base structure and receives a second probe therein. The second probe is configured to interface with a second contact of the electrical component wherein the first and second contacts have a spatial relationship therebetween. An adjustment mechanism is connected to the first and second housing and configured to independently adjust an amount of rotation of the each of the housings to accommodate the spatial relationship.

19 Claims, 5 Drawing Sheets

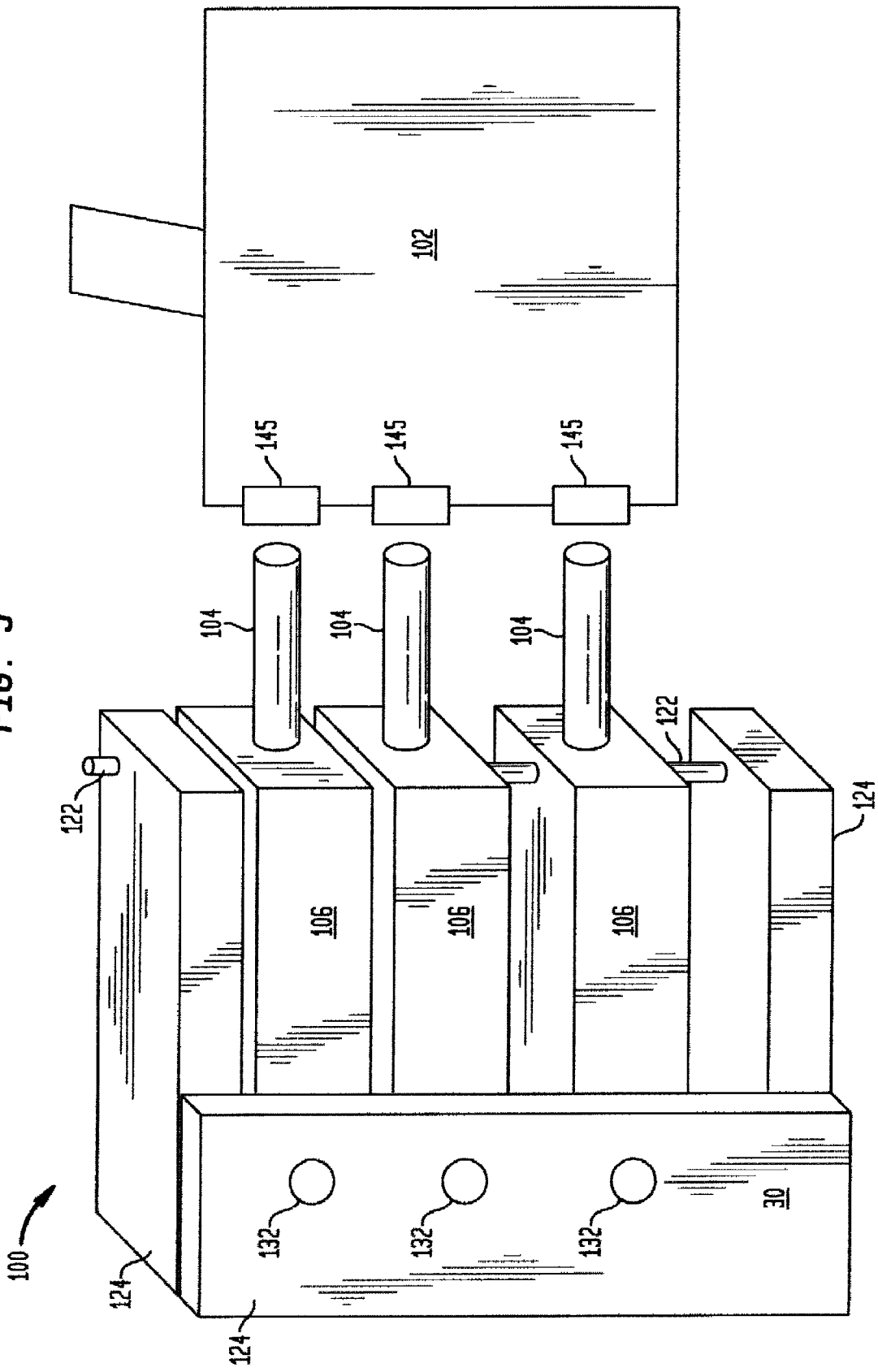

ADJUSTABLE ELECTRICAL PROBES FOR CIRCUIT BREAKER TESTER

RELATED APPLICATION INFORMATION

This application claims priority to provisional application Ser. No. 61/029,626 filed on Feb. 19, 2008, incorporated herein by reference.

BACKGROUND

1. Technical Field

This disclosure relates to electrical test fixtures, and more particularly, to a device and method for adjustable configuring test probes to perform testing on different electrical component configurations.

2. Description of the Related Art

In circuit breakers, a location of a lug and neutral strap may vary between different designs. In production, the different designs may need to employ the same test equipment, but the differences in the designs preclude such use. In conventional systems, functional production fixtures use electrical probes that are fixed in a housing and are not adjustable. To accommodate different components to be tested, the probes are manually bent by technicians to attempt to properly interface this connection with the component to be tested. Typically, the probes are bent by the use of a hammer or pliers. Due to these bending methods of the probes, the accuracy can vary greatly between testers and components to be tested. For example, a breaker may be non-conforming in one tester while passing in a different tester. This may be due to the location of the bent probes and the quality of the connection.

Further, the probes and the test fixtures are subject to damage due to the bending methods. Tooling of the probe is an additional disadvantage to the existing design since the probes usually are fabricated to prevent rotation of the probes during operation. For example, the electrical probes are hexagonal in shape and require special tooling to produce them. This type of design is employed so that the electrical probes do not rotate.

Electrical probes are usually supported in a single block configuration that cannot be adjusted in any manner. This requires that the location of the probes be exactly in position so that they interface with the line lug and neutral strap of a circuit breaker, for example. In some cases, the lugs may touch the plastic housing of the circuit breaker missing their target rather than making an electrical contact with the lug. The probe alignment becomes an issue in manufacturing during functional testing since circuit breaker designs may be different. Without proper electrical contact, the breakers could fail testing due to a lack of electrical continuity. Any design changes in the lug area of the breaker could require adjustments in the functional tester itself.

Typically, manufacturing will manually adjust the probes to meet the new design. However, this manual bending is not controlled to any specification, and the amount of bending varies from tester to tester and operator to operator.

SUMMARY OF THE INVENTION

An electrical probe assembly includes a first probe housing pivotally connected to a base structure and receiving a first probe therein. The first probe is configured to interface with a first contact of an electrical component. A second probe housing is pivotally connected to the base structure and receives a second probe therein. The second probe is configured to interface with a second contact of the electrical component wherein the first and second contacts have a spatial relationship therebetween. An adjustment mechanism is connected to the first and second housing and configured to independently adjust an amount of rotation of the each of the housings to accommodate the spatial relationship.

An electrical probe assembly for interfacing with a plurality of different circuit breaker designs includes a plurality of probe housings each having a corresponding test probe protruding therefrom. A pivot pin is configured to pass through the plurality of housings to pivotally connect the housings to a base structure such that the plurality of housings independently rotate about a same axis. An adjustment mechanism is connected to the plurality of housings and configured to independently adjust an amount of rotation of the each of the housings to accommodate different spatial relationships for contacts of different circuit breaker designs.

A method for testing a circuit breaker includes providing an electrical probe assembly having a first probe housing pivotally connected to a base structure and receiving a first probe therein, the first probe being configured to interface with a first contact of a circuit breaker, a second probe housing pivotally connected to the base structure and receiving a second probe therein, the second probe being configured to interface with a second contact of the circuit breaker wherein the first and second contacts have a spatial relationship therebetween, and an adjustment mechanism connected to the first and second housing; adjusting the adjustment mechanism to independently adjust an amount of rotation of each of the housings to accommodate the spatial relationship of contacts for a circuit breaker design; and testing the circuit breaker.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein:

FIG. 5 is a perspective view of a probe assembly employed in testing electrical components showing a three probe arrangement for testing a circuit breaker in accordance with one illustrative embodiment.

DETAILED DESCRIPTION OF PREFERRED EMBODIMENTS

The present invention provides adjustable electrical probes for functional testers that interface with a circuit breaker. The present principles may be used to retrofit existing functional testers in manufacturing facilities or may be part of the design of new functional testers. In one illustrative example, the probes may be employed in conjunction with any of a plurality of commercially available functional testers, e.g., for manufacture testing circuit breakers. The tester provides an electrical connection interface between a circuit breaker to be tested and the tester itself This interface may benefit from the present principles, which would then be employed to test the circuit breaker in manufacturing to ensure the end product meets test standards.

An improved electrical probe is provided to interface with the breaker. This probe provides the ability to make adjustments to a probe location to ensure electrical connection can be made even if a breaker design has changed. For example, a lug position or neutral strap position may have been related in a breaker design. In one embodiment, the probe employs industry standard bar stock as a core material to ensure easy replacement of the probe connections. To address the anti-rotation needed for the electrical probes, a key located in the probe housing may be employed, among other things.

The present embodiments will be described in terms of a probe assembly for a circuit breaker tester; however, the present principles are not limited to the illustrative example is and may be employed with other electrical component testers or even other devices where adjustments are needed to properly interface two components. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). Thus, for example, it will be appreciated by those skilled in the art that the block diagrams presented herein represent conceptual views of illustrative system components and/or circuitry embodying the principles of the invention.

Figure 1:
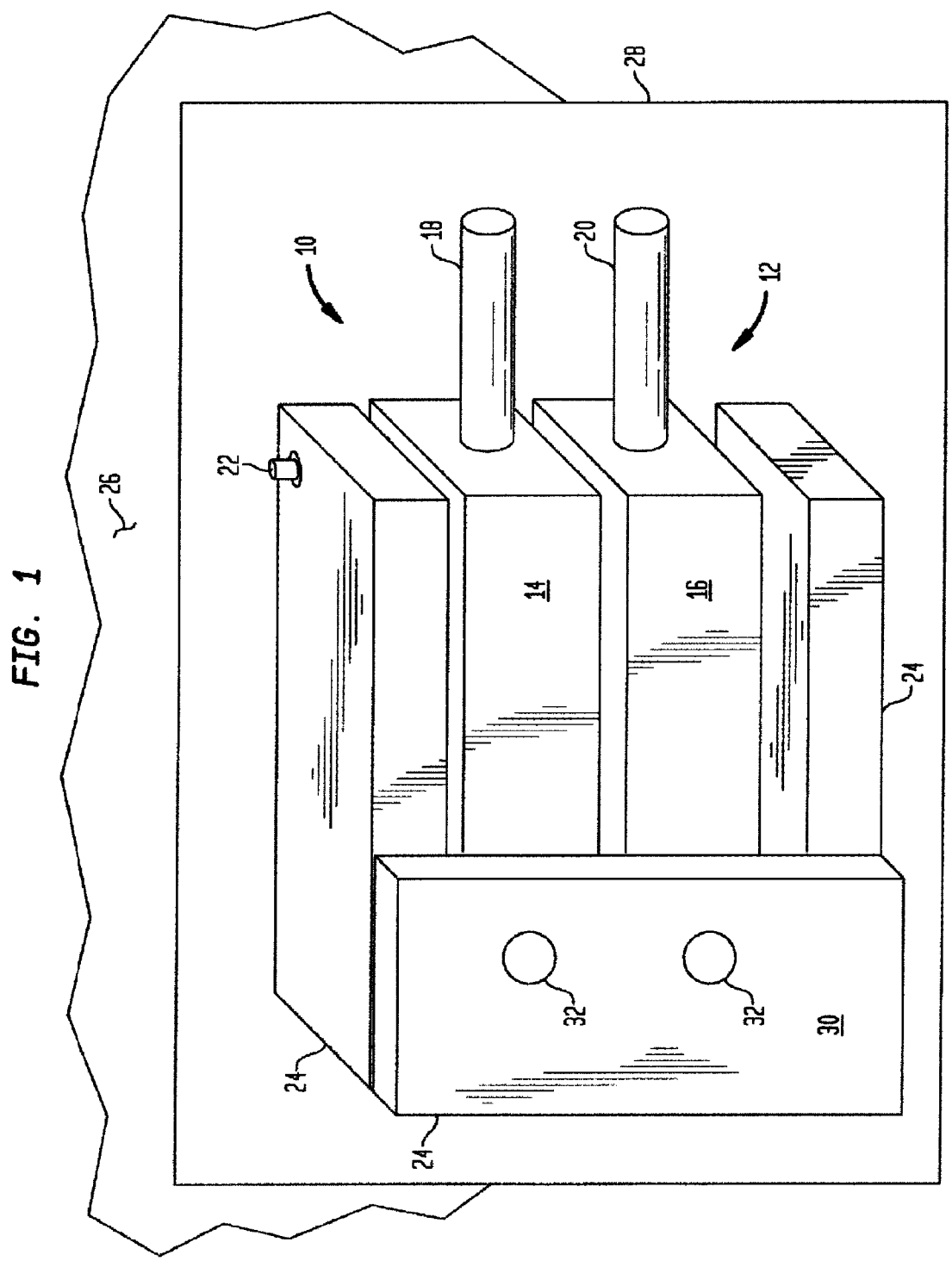
FIG. 1 is a perspective view of a probe assembly employed in testing electrical components in accordance with one illustrative embodiment.

Referring now in specific detail to the drawings in which like reference numerals identify similar or identical elements throughout the several views, and initially to FIG. 1, an adjustable probe assembly 10 is shown in accordance with one illustrative embodiment. Assembly 10 provides a probe interface 12 configured to generally interface with a single pole circuit breaker (not shown) in accordance with one embodiment. The interface 12 includes probe housings 14 and 16. Each probe housing 14 and 16 respectively includes an electrical probe 18 and 20. As illustratively depicted, the probe 18 corresponds to a lug probe and the probe 20 corresponds to a neutral probe.

Each electrical probe 18 and 20 is mounted within its respective probe housing 14 and 16, which are independently positionable relative to each other. A pivot pin 22 or other pivoting mechanism permits pivotal motion of each of housings 14 and 16 relative to a base structure such as support blocks 24 or other structures. Support block(s) 24 is mountable on or connectable to a tester 26. In the example, the tester 26 includes a plate 28 mounted thereon. The interface between the tester 26 and the plate 28 may include bolts or other hardware (not shown) to secure the support block to the plate 28, which in turn, is supported by the tester 26. The plate 28 provides electrical lines to be routed from the tester 26 to the probe housings 14 and 16 to permit electrical testing using the probes 18 and 20.

Support block 24 includes a portion 30 that partially encloses the probe housings 14 and 16. Portion 30 provides a support area configured with manual or automatic adjustment controls for rotating the probes housing 14 and 16 thereby changing the angle of probes 18 and 20 to provide a desired adjustment. An adjustment mechanism 32 is illustratively depicted as an adjustment screw for each housing 14 and 16; however, the adjustment mechanism 32 may include any number of mechanisms such as, e.g., a servo, a thumb or power screw, a cammed adjustment member, a pneumatic cylinder, a hydraulic cylinder or any other suitable device.

Figure 2:
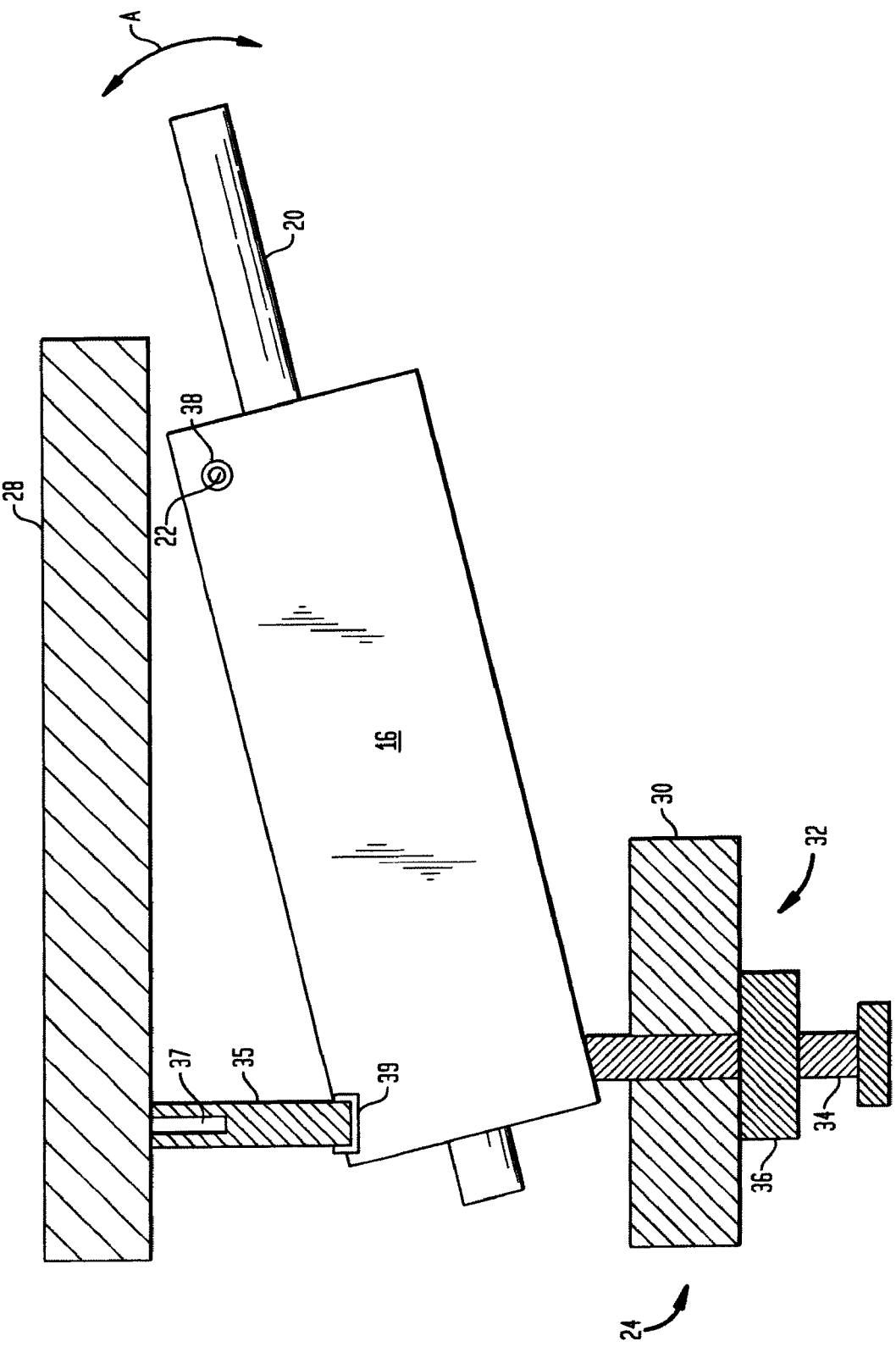
FIG. 2 is a partial cross-sectional view of the assembly of FIG. 1 showing an illustrative adjustment mechanism in accordance with one illustrative embodiment.

Referring to FIG. 2, a cut away view of the portion 30 of support block 24 and plate 28 shows the housing 16 of the neutral probe 20 for illustration purposes. The housing 14 for the lug probe 18 includes a similar structure. The portion 30 of the support block 24 supports the adjustment mechanism 32, in this case, an adjustment screw 34. The adjustment screw 34 may be advanced or withdrawn from the position 30 in accordance with its threads. A jam nut 36 may be employed to secure the position of the screw 34 once the appropriate position is achieved. In this case, a biasing member 35 is employed at a position opposite the adjustment screw 34 to provide a restoring force to the housing 16. The biasing member 35 may include a compression spring, Belleville washers, a pneumatic chamber, etc. It should be noted that depending on the adjustment mechanism selected the biasing member 35 is optional. For example, if the adjustment screw 34 is attached with a bearing-like connection to the housing 16, the screw 32 may be employed as both an advancing and withdrawing adjustment member.

The housing 16 (and housing 14) has a pivot hole 38 formed therethrough to receive a pivot pin 22. In this way, a pivot action in the direction of arrow "A" is provided to adjust the housings 14 and 16 and thereby adjust the positions of probes 18 and 20.

Advantageously, both probe housings 14 and 16 can rotate freely about a single axis (pivot pin 22). The pivot pin 22 is supported in a lower portion of the support block 24 and held in a top portion of the support block 24 by a retaining clip 44 (see FIG. 3). Both probe housings 14 and 16 may have a recessed area 39 on the back side to capture one end of a compression spring 35. An opposite end of the spring 35 would rest on the existing mounting plate 28 (or support block 24 depending on the design) and provide a force that would bias the probe housings 14 and 16. If the spring 35 needs to be captured, then a locating pin 37 may be provided for the spring 35.

Figure 3:
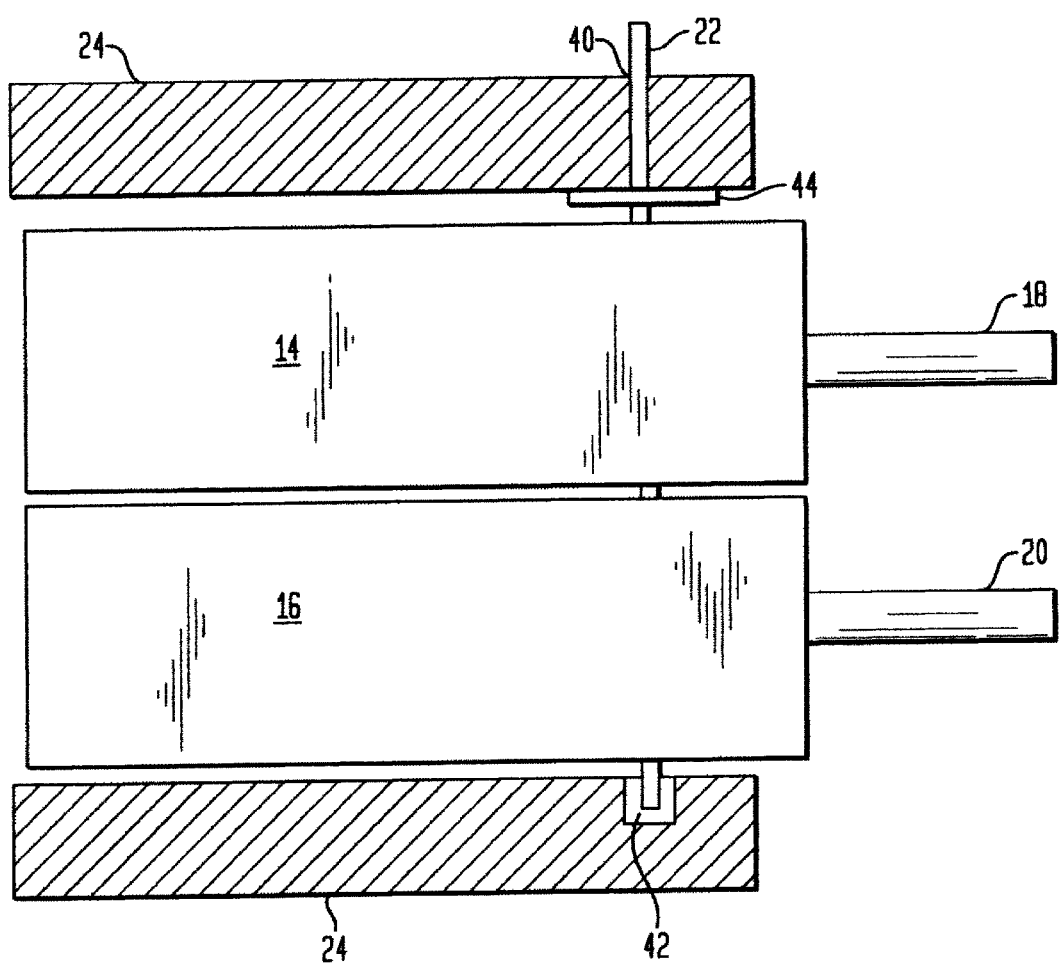
FIG. 3 is a partial cross-sectional view of the assembly of FIG. 1 showing a pivot pin arrangement in accordance with one illustrative embodiment.

Referring to FIG. 3, an illustrative arrangement of the pivot pin 22 is shown. Support block 24 includes a pivot hole 40 therein which receives the pivot pin 22 therein. The pivot pin 22 passes through both housings 14 and 16 and is seated in a recess 42 on a lower portion of the support block 24. A retaining clip or cotter pin 44 may be employed to prevent removal of the pin 22 and/or to improve operation of the pivot formed by the pin 22. In an alternate embodiment, the pin 22 may be captured between the upper and lower support blocks 24, and the cotter pin 44 may be eliminated. Other configurations are also contemplated.

Figure 4:
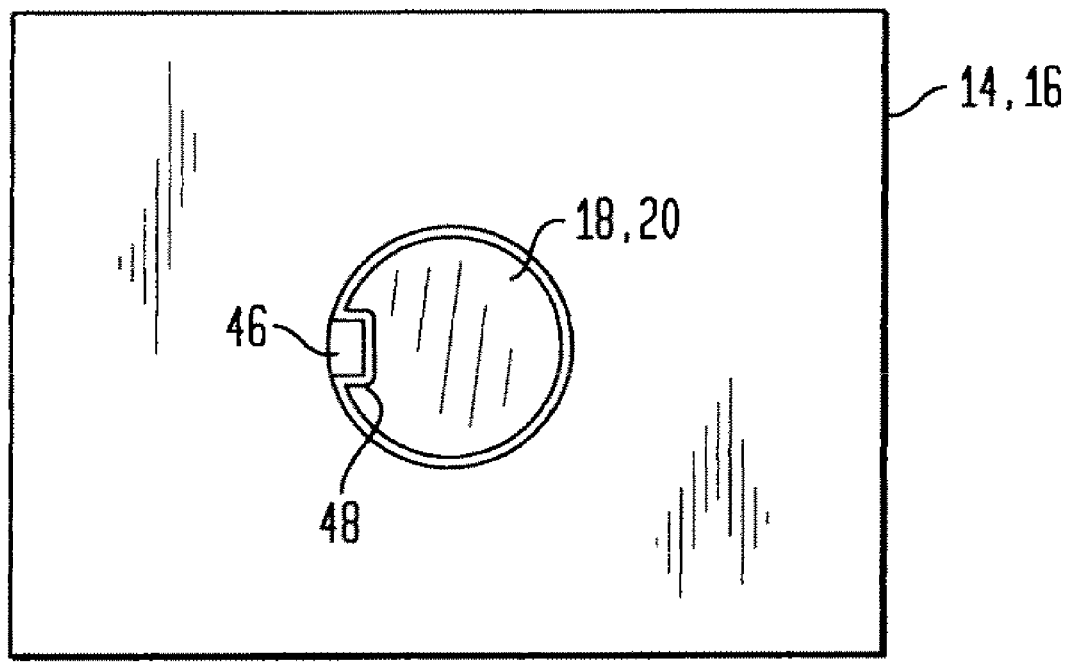
FIG. 4 is a front view showing an anti-rotation key for preventing rotation of test probes in accordance with one illustrative embodiment.

Referring to FIG. 4, a front view of one of the housings 14 (or 16) is illustratively shown. The housing 14 may include a key 46. The probe 18 (or 20) includes a corresponding keyway 48 formed therein. In this way, rotational motion of the probe 18 is eliminated. By employing standard bar stock or wire, the probe 18 or 20 can easily be replaced. While a flat or keyway 48 may be formed in the probe 18 or 20, a set screw or similar mechanism may also be employed to prevent rotation. As the electrical probes 18 or 20 are inserted into the probe housing 14 or 16, the probe 18 or 20 interfaces with the key 48 and prevents rotation of the probes.

Referring to FIG. 5, a three housing block probe assembly 100 is illustratively depicted with a two pole circuit breaker 102 for testing. In this embodiment, three probes 104 are provided on three separate housings 106. Each housing 106 is independently adjustable about a pivot 122 relative to each other and a support block(s) 124. Adjustments are made using three independent adjustment screws 132. The probes 104 are configured to test a two pole circuit breaker 102 by interfacing with contacts 145. Other embodiments may include a greater number of probes 104 and housings 106 as needed.

It is contemplated that the adjustment mechanism (32 or 132) may be made much more complex and may be automatically adjusted using pneumatics or servos. A technician may be able to program the tester to remember (in memory a particular setting for testing a particular circuit breaker. A code may be entered or a button may be pressed to automatically adjust the probes for that particular circuit breaker. Manual or local adjustments may also be made as well. Further, one embodiment may permit independent adjustment for x, y and z translational displacements of one or more of housing 106 (or 14 and 16).

Having described preferred embodiments for adjustable electrical probes for circuit breaker tester (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. An electrical probe assembly, comprising:
a first probe housing pivotally connected to a base structure and receiving a first probe therein, the first probe being configured to interface with a first contact of an electrical component;
a second probe housing pivotally connected to the base structure and receiving a second probe therein, the second probe being configured to interface with a second contact of the electrical component wherein the first and second contacts have a spatial relationship therebetween, and wherein a pivoting mechanism permits independent pivotal motion of the first probe housing and the second probe housing relative to the base structure; and
an adjustment mechanism connected to each of the first and second housing and the base structure and configured to independently adjust an amount of rotation of the each of the housings relative to the base structure to accommodate the spatial relationship.

2. The probe assembly as recited in claim 1, wherein the first and second probes are circular in cross-section and are formed from one of a standard wire and bar gage.

3. The probe assembly as recited in claim 2, wherein the first and second probe housings include anti-rotation openings for respectively receiving the first and second probes, the probes being modified to fit in the corresponding anti-rotation openings to prevent rotation of the probes.

4. The probe assembly as recited in claim 1, wherein both of the first and second housings are pivotally connected to the base structure by a pivot pin.

5. The probe assembly as recited in claim 4, wherein the pivot pin passes through the first housing and the second housing such that the first housing and the second housing independently rotate about a same axis.

6. The probe assembly as recited in claim 1, wherein the adjustment mechanism includes an adjustment screw.

7. An electrical probe assembly, comprising:
a first probe housing pivotally connected to a base structure and receiving a first probe therein, the first probe being configured to interface with a first contact of an electrical component;
a second probe housing pivotally connected to the base structure and receiving a second probe therein, the second probe being configured to interface with a second contact of the electrical component wherein the first and second contacts have a spatial relationship therebetween;
an adjustment mechanism connected to the first and second housing and configured to independently adjust an amount of rotation of the each of the housings to accommodate the spatial relationship wherein the adjustment mechanism includes an adjustment screw; and
a biasing device disposed on an opposing side from the adjustment screw of at least one of the first and second housings for providing a restoring force to permit bidirectional adjustment.

8. An electrical probe assembly, comprising:
a first probe housing pivotally connected to a base structure and receiving a first probe therein, the first probe being configured to interface with a first contact of an electrical component;
a second probe housing pivotally connected to the base structure and receiving a second probe therein, the second probe being configured to interface with a second contact of the electrical component wherein the first and second contacts have a spatial relationship therebetween;
a third probe housing pivotally connected to the base structure and receiving a third probe therein, the third probe being configured to interface with a third contact of the electrical component; and
an adjustment mechanism connected to the first and second housing and configured to independently adjust an amount of rotation of the each of the housings to accommodate the spatial relationship.

9. The probe assembly as recited in claim 1, wherein the base structure is supported by a circuit breaker tester and the electrical component is a circuit breaker.

10. An electrical probe assembly for interfacing with a plurality of different circuit breaker designs, comprising:
a plurality of probe housings each having a corresponding test probe extending therefrom;
a pivot pin configured to pass through the plurality of housings to pivotally connect the housings to a base structure such that the plurality of housings independently rotate about a same axis; and
an adjustment mechanism connected to each of the plurality of housings and the base structure and configured to independently adjust an amount of rotation of the each of the housings to accommodate different spatial relationships for contacts of different circuit breaker designs wherein the pivot pin permits independent pivotal motion of each of the housings relative to the base structure.

11. The probe assembly as recited in claim 10, wherein the test probes are circular in cross-section and are formed from one of a standard wire and bar gage.

12. The probe assembly as recited in claim 11, wherein the housings include anti-rotation openings for respectively receiving the test probes, the test probes being modified to fit in the corresponding anti-rotation openings to prevent rotation of the probes.

13. The probe assembly as recited in claim 10, wherein the adjustment mechanism includes an adjustment screw for each housing.

14. The probe assembly as recited in claim 13, further comprising, for each housing, a biasing device disposed on an opposing side of the housings from the adjustment screw for providing a restoring force to permit bidirectional adjustment.

15. The probe assembly as recited in claim 10, wherein the base structure is supported by a circuit breaker tester.

16. A method for testing a circuit breaker, comprising:

providing an electrical probe assembly having a first probe housing pivotally connected to a base structure and receiving a first probe therein, the first probe being configured to interface with a first contact of a circuit breaker, a second probe housing pivotally connected to the base structure and receiving a second probe therein, the second probe being configured to interface with a second contact of the circuit breaker wherein the first and second contacts have a spatial relationship therebetween, and an adjustment mechanism connected to each of the first and second housing and the base structure, and wherein a pivoting mechanism permits independent pivotal motion of the first probe housing and the second probe housing relative to the base structure;

adjusting the adjustment mechanism to independently adjust an amount of rotation of each of the housings to accommodate the spatial relationship of contacts for a circuit breaker design; and testing the circuit breaker by contacting the first and second probes with the first and second contacts.

17. The method as recited in claim 16, further comprising preventing rotation of the probes relative to the housings wherein the probes include circular cross section standard wire or standard bar stock.

18. The method as recited in claim 16, wherein adjusting the adjustment mechanism includes pivotally connecting the housings to the base structure such that the housings independently rotate about a same axis.

19. The method as recited in claim 16, wherein the adjustment mechanism includes an adjustment screw and the method includes adjusting the adjustment screw to rotate at least one of the housings.

* * * * *